(12) United States Patent
Hiramoto et al.

(10) Patent No.: US 6,989,569 B1
(45) Date of Patent: Jan. 24, 2006

(54) MOS TRANSISTOR WITH A CONTROLLED THRESHOLD VOLTAGE

(75) Inventors: Toshiro Hiramoto, Yokohama (JP); Makoto Takamiya, Tokyo (JP)

(73) Assignee: The University of Tokyo, Tokyo (JP)

( * ) Notice: Subject to any disclaimer, the term of this patent is extended or adjusted under 35 U.S.C. 154(b) by 1023 days.

(21) Appl. No.: 09/389,321

(22) Filed: Sep. 3, 1999

(30) Foreign Application Priority Data

Mar. 5, 1999 (JP) ................................. 11-058958

(51) Int. Cl.
*H01L 29/78* (2006.01)

(52) U.S. Cl. ...................... 257/347; 257/257; 257/347; 257/348; 257/35

(58) Field of Classification Search ................ 257/347, 257/348, 351, 353, 369; 438/149
See application file for complete search history.

(56) References Cited

U.S. PATENT DOCUMENTS

| | | | | |
|---|---|---|---|---|
| 5,698,885 A | * | 12/1997 | Warashina et al. | ........... 257/349 |
| 6,100,567 A | * | 8/2000 | Burr | ........................ 257/365 |

FOREIGN PATENT DOCUMENTS

| | | |
|---|---|---|
| JP | 7-131025 | 5/1995 |
| JP | 9-162417 | 6/1997 |
| JP | 10-256556 | 9/1998 |
| JP | 2000260991 A * | 9/2000 |

OTHER PUBLICATIONS

F. Assaderaghi et al, "A Dynamic Threshold Voltage MOS-FET (DTMOS) for Ultra-Low Voltage Operation", IEEE, 1994, 33.1.1-33.1.4.

* cited by examiner

*Primary Examiner*—Nathan J. Flynn
*Assistant Examiner*—Tom Dickey
(74) *Attorney, Agent, or Firm*—Buchanan Ingersoll PC

(57) ABSTRACT

A MOS transistor with a controlled threshold voltage includes a SOI which includes a substrate composed of a semi-conducting material, a single crystal layer composed of a semi-conducting material and an insulating layer interposed between the substrate and the single crystal layer. The single crystal layer is formed therein with a source region, a drain region and a surrounded region surrounded by the source region and the drain region. The surrounded region includes a depletion layer having a composition surface which is in contact with the insulating layer. The MOS transistor comprises an EIB-MOS transistor of which the substrate is adapted to be applied with a voltage of a first polarity for inducing charges of a second polarity over the composition surface of the surrounded region.

12 Claims, 9 Drawing Sheets

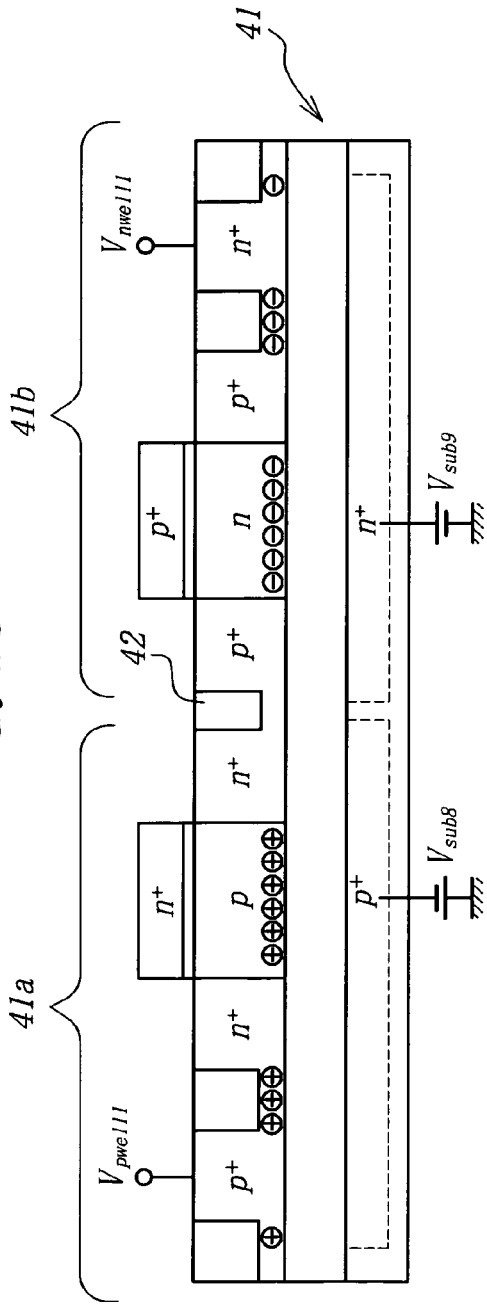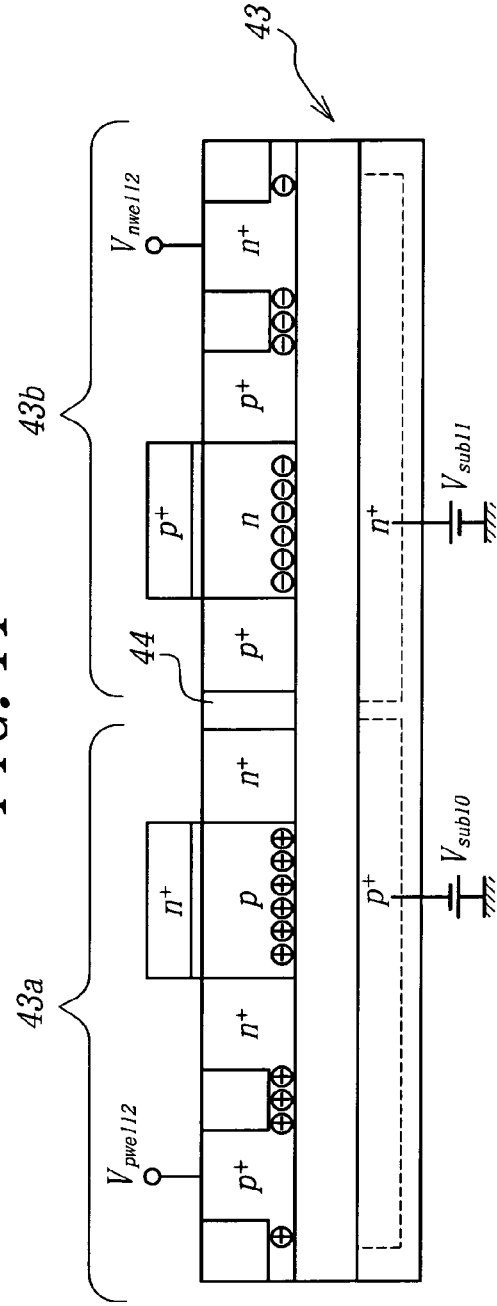

MOS TRANSISTOR WITH A CONTROLLED THRESHOLD VOLTAGE

BACKGROUND OF THE INVENTION

1. Field of the Invention

The present invention relates to a MOS transistor with a controlled threshold voltage. Such a MOS transistor may form a VLSI (very large scale integrated circuit), for example.

2. Description of the Related Art

A present VLSI has a large power consumption. Recently, most VLSIs driven by one or more batteries are used, such VLSIs is adapted to a portable terminal application, for example, and thus it is a pressing need to reduce the power consumption of the VLSI remarkably while a fast operation of the VLSI is maintained.

In a Metal-Oxide-Semiconductor (MOS) transistor which composes the VLSI, the most important parameter related to the fast operation and the power consumption of the MOS transistor is a threshold voltage of the MOS transistor. To realize the fast operation of the MOS transistor, it is necessary to lower the threshold voltage. However, a leakage current, when the MOS transistor is turned off, increases if the threshold voltage is low. As a result, the power consumption of the MOS transistor increases.

Normally, the threshold voltage is approximately constant while the transistor is turned on and off, however, it is possible to control the threshold voltage by changing a substrate voltage of the MOS transistor. That is, the threshold voltage shift $\Delta V_{th}$ is expressed according to the following equation.

$$\Delta V_{th} = -V_{bs} \quad (1)$$

wherein $\gamma$ is a body effect factor of the MOS transistor. Therefore, one way to compromise the fast operation and the reduction of the power consumption of the MOS transistor is that the threshold voltage is lowered when the MOS transistor is turned on and rises when the MOS transistor is turned off by changing the substrate voltage of the MOS transistor.

A VTMOS (Variable Threshold MOS) technique and a DTMOS (Dynamic Threshold MOS) technique are proposed in such a way.

In case of a VTMOS transistor composed by using the VTMOS technique, the threshold voltage of the VTMOS transistor is controlled by a whole of a chip in which the VTMOS transistor is provided. In this case, a first voltage is applied to a substrate of the VTMOS transistor in the active mode, and a second voltage smaller than the first voltage is applied to the substrate in the standby mode, thereby, the threshold voltage rises.

On the other hand, a DTMOS transistor such as a n type DTMOS transistor shown in FIG. 1 composed by using the DTMOS technique comprises a SOI 4 which includes a substrate 1 composed of a p type semiconducting material (e.g. silicon), a single crystal layer 2 composed of a semiconducting material (e.g. silicon) and an insulating layer 3 (e.g. silicon dioxide layer) interposed between the substrate 1 and the single crystal layer 2. The single crystal layer 2 is formed therein with a n type source region 5, a n type drain region 6 and a p type body 7 surrounded by the source region 5 and the drain region 6. Further, a gate electrode 9 deposited on the body 7 through a gate oxide 8 is electrically connected to the body 7 through a wire 10 so that the threshold voltage of the DTMOS transistor is controlled. In other words, the threshold voltage is always lowered when the DTMOS transistor is turned on, and it always rises when it is turned off.

Gate characteristics of the DTMOS transistor and a conventional MOS transistor are explained with reference to a graph in FIG. 2. In FIG. 2, each of gate voltages $V_{gs}$ of these transistors is plotted on a horizontal line of the graph, and each of drain currents $I_{ds}$ of these transistors is plotted on a vertical line of the graph. A curve corresponding to $V_{bs}=0$ represents the characteristics of the conventional MOS transistor. As a substrate voltage $V_{bs}$ of the DTMOS transistor is equal to the gate voltage $V_{gs}$ when it is turned on, the threshold voltage is lowered by $\Delta V_{th}$. If leakage currents of the conventional MOS transistor the DTMOS transistor are same, a gate driving force of the DTMOS transistor improves by $\Delta V_{th}$. Also, $V_{dd}$ represents a voltage supply voltage in FIG. 2.

In such a way, it is possible to reduce the power consumption of the MOS transistor while a fast operation of the MOS transistor is maintained by using the VTMOS technique or the DTMOS transistor.

With reference to the equation (1), in order to control the threshold voltage effectively, it is preferable to make the body effect factor $\gamma$ high. However, in general, it is necessary to raise an impurity concentration of the MOS transistor in order to make the body effect factor of the MOS transistor high. As a result, the threshold voltage itself rises, and the fast operation of the MOS transistor is degraded. In such a circumstance, an optimization of the body effect factor $\gamma$ has not been performed so far, and the body effect factor $\gamma$ is normally about 0.1 to 0.3.

Here, each of the body effect factors $\gamma$ of the conventional MOS transistor and a fully depleted SOI MOS transistor is explained with reference to FIGS. 3 and 4, respectively. In case of a conventional MOS transistor having a n type channel, a substrate 13 in which a source region 11 and a drain region 12 are formed in n type, and in case of a conventional MOS transistor having a p type channel, the substrate 13 is p type. The body effect factors $\gamma$ of the conventional MOS transistor is expressed as the following equation.

$$\gamma \approx 3 t_{fox1}/l_d \quad (2)$$

Wherein $t_{fox1}$ is a thickness of a gate oxide 15 interposed between the substrate 13 and a gate electrode 14, and $l_d$ is a depth of a depletion layer formed directly below the gate oxide 15. Therefore, it is necessary to raise the impurity concentration and lower the depth $l_d$ in order to make the body effect factors $\gamma$ high. However, the threshold voltage becomes high if the impurity concentration becomes high, as described. This situation holds true in case of a partially depleted SOI MOS transistor.

On the other hand, the body effect factors $\gamma$ of the fully depleted SOI MOS transistor as shown in FIG. 4 is expressed as the following equation.

$$\gamma \approx 3 t_{fox2}/(3 t_{box} + t_{SO I1}) \quad (3)$$

Wherein $t_{box}$ is a thickness of an insulating layer 18 of a SOI 16, $t_{SOI1}$ is a thickness of a single crystal layer 17 of the SOI 16, and $t_{fox2}$ is a thickness of a gate oxide 19. In this case, the depth of the depletion layer corresponds to $t_{box} + t_{SOI1}$.

Recently, it is desirable to increase the body effect factor while the threshold voltage is lowered in order to utilize characteristics of the VTMOS technique and the DTMOS technique more than usual as well as compromise the fast operation of the MOS transistor and reduction of the power consumption of the MOS transistor. However, it is difficult to compromise these requirements because of the disadvantage as already stated.

DISCLOSURE OF THE INVENTION

It is an object of the present invention to provide a MOS transistor with a threshold voltage and a method of controlling a threshold voltage of a MOS transistor which are capable of operating the circuit including such a MOS transistor at higher speed and reducing a power consumption of the circuit including such a MOS transistor.

According to the present invention, there is provided a MOS transistor with a controlled threshold voltage, comprising a SOI which includes a substrate composed of a semi-conducting material, a single crystal layer composed of a semi-conducting material and an insulating layer interposed between the substrate and the single crystal layer, the single crystal layer being formed therein with a source region, a drain region and a surrounded region surrounded by the source region and the drain region, the surrounded region including a depletion layer having a composition surface which is in contact with the insulating layer, the MOS transistor comprising an EIB-MOS transistor of which the substrate is adapted to be applied with a voltage of a first polarity for inducing charges of a second polarity over the composition surface of the surrounded region.

In this case, the substrate is adapted to be applied with a voltage of the first polarity, i.e. one of a positive voltage and a negative voltage, so that charges of the first polarity are induced into the substrate. In other words, positive charges or holes are induced into the substrate when the positive voltage is subject to be applied, and negative charges or electrons are induced into the substrate when the negative voltage is subjected to be applied. By inducing the charges of the first polarity in such a way, the charges of the second polarity are induced over the composite surface of the surrounded region. That is, the negative charges or electrons are induced over the composite surface of the surrounded region when the positive voltage is adapted to be applied to the substrate, and the positive charges or holes are induced over the composite surface of the surrounded region when the negative voltage is adapted to be applied to the substrate.

As there are charges of the second polarity over the composite surface of the surrounded region, a depth of the depletion layer of the MOS transistor corresponds to a thickness of the single crystal layer. As already described, the body effect factor of the MOS transistor is inversely proportional to the depth of the depletion layer of the MOS transistor, it is possible to have a larger body effect factor than that of the conventional fully depleted SOI MOS transistor whose depth of the depletion layer corresponds to the sum of the thickness of the single crystal layer and that of the insulating layer. Therefore, according to the MOS transistor of the invention, it is possible to have a large body effect factor without increasing the impurity concentration, and thus it is possible to operate the circuit including the MOS transistor at higher speed and reduce a power consumption of the circuit including the MOS transistor.

According to the present invention, there is provided a method of controlling a threshold voltage of a MOS transistor with a controlled threshold voltage, the MOS transistor being an EIB-MOS transistor and comprising a SOI which includes a substrate composed of a semi-conducting material, a single crystal layer composed of a semi-conducting material and an insulating layer interposed between the substrate and the single crystal layer, the single crystal layer being formed therein with a source region, a drain region and a surrounded region surrounded by the source region and the drain region, the surrounded region including a depletion layer having a composition surface which is in contact with the insulating layer, wherein the method comprises the step of applying a voltage of a first polarity to the substrate for inducing charges of a second polarity over the composite surface of the surrounded region.

In this case, it is possible to operate the circuit including the MOS transistor at higher speed and reduce a power consumption of the circuit including the MOS transistor.

The EIB-MOS transistor may comprise a EIB-DTMOS transistor. Preferably, the EIB-DTMOS transistor comprises an accumulation mode EIB-DTMOS transistor having a channel which is doped with impurities so that the channel has the same conductive type as that of carriers introduced into the channel. Further, the EIB-MOS transistor may comprises a EIB-VTMOS transistor. Moreover, the EIB-MOS transistor is included in a CMOS (Complementary MOS) circuit as one of pair of the EIB-MOS transistors.

BRIEF DESCRIPTION OF THE DRAWINGS

FIG. 10 is a schematic diagram showing a sixth embodiment of the MOS transistor according to the present invention; and FIG. 11 is a schematic diagram showing a seventh embodiment of the MOS transistor according to the present invention

DESCRIPTION OF THE PREFERRED EMBODIMENTS

Figure 1:
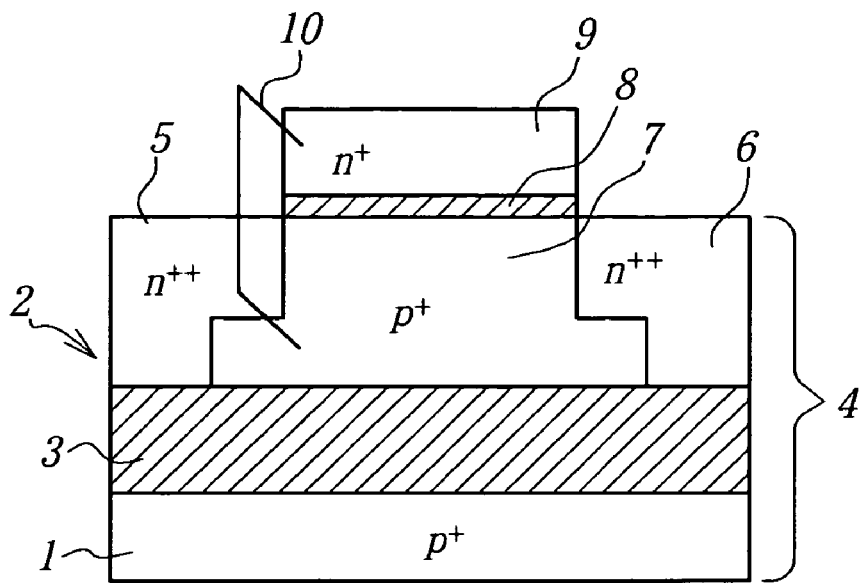
FIG. 1 is a schematic diagram showing a conventional DTMOS transistor.
Figure 2:
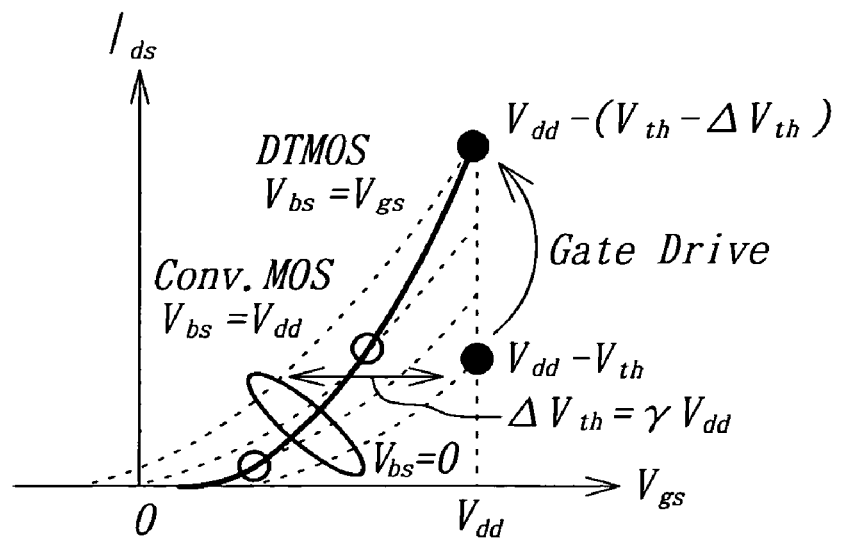
FIG. 2 is a graph showing gate characteristics of the DTMOS transistor and a normal MOS transistor.
Figure 3:
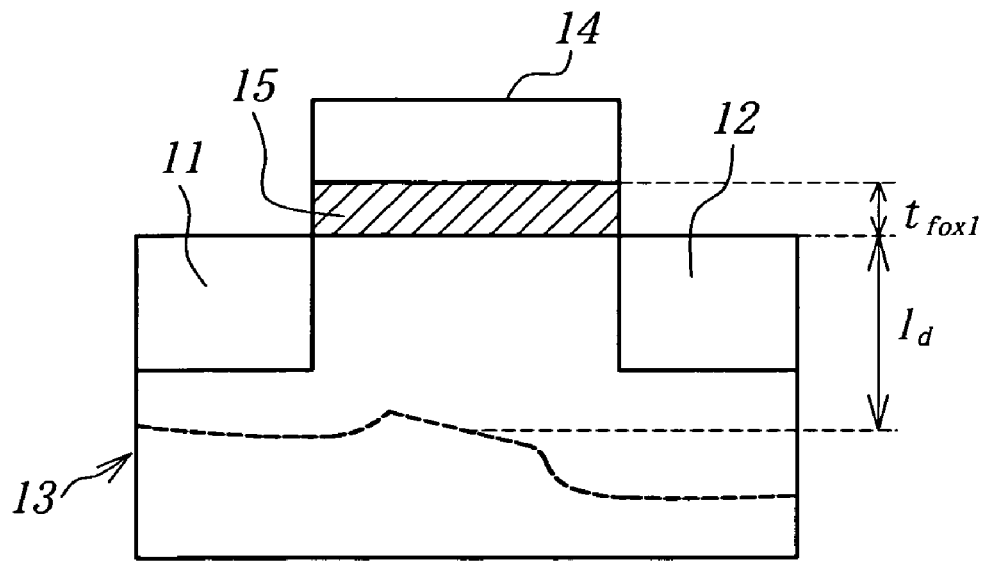
FIG. 3 is a schematic diagram showing a conventional MOS transistor.
Figure 4:
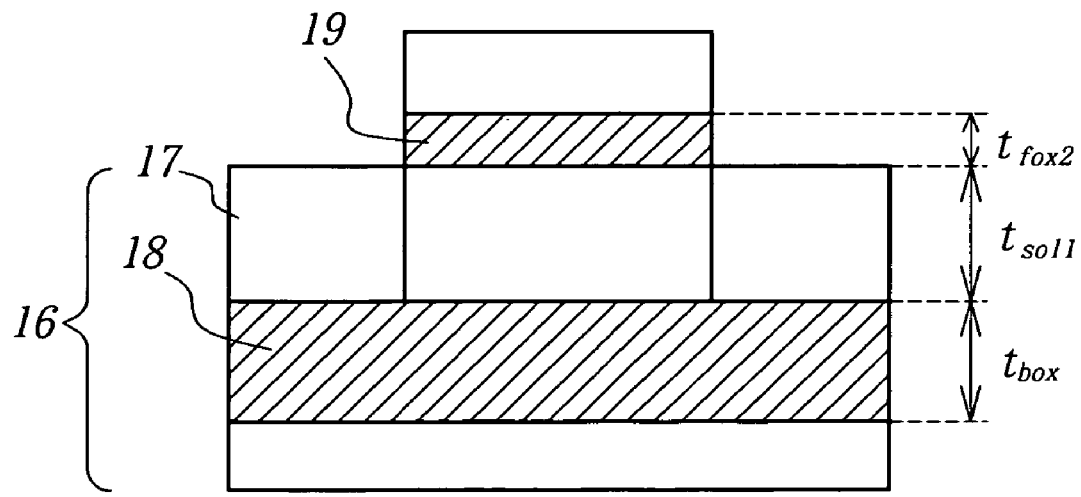
FIG. 4 is a schematic diagram showing a conventional fully depleted SOI MOS transistor.

Embodiment of the MOS transistor according to the present invention will be explained below with reference to the accompanying drawings, wherein the same reference numerals denote the same or corresponding elements.

Each of Signs n, p, etc. in the drawings represents a conductive type in respective regions.

Figure 5:
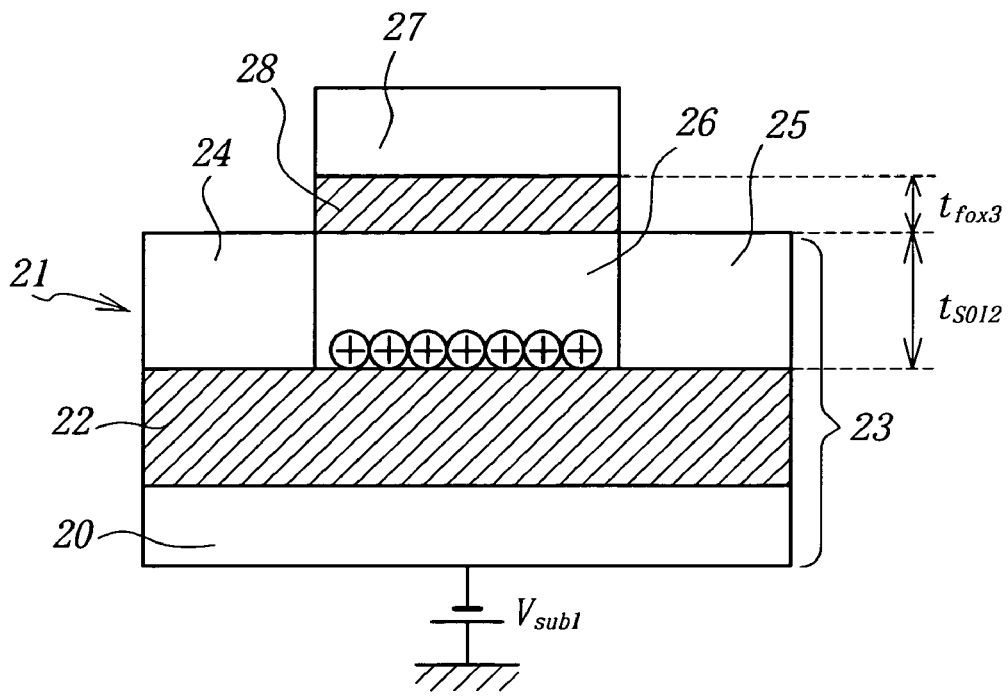
FIG. 5 is a schematic diagram showing a first embodiment of the MOS transistor according to the present invention.

FIG. 5 is a schematic diagram showing a first embodiment of the MOS transistor according to the present invention. In the embodiment, a n type SOI MOS transistor is used as the MOS transistor. The SOI MOS transistor comprises a SOI 23 which has a substrate 20 composed of a silicon, a single crystal layer 21 composed of a single crystal silicon and an insulating layer 22 interposed between the substrate 20 and the single crystal layer 21. The insulating layer 22 is composed of $SiO_2$.

The single crystal layer being formed therein with a n type source region 24, a n type drain region 25 and a body 26 as the surrounded region surrounded by the source region 24 and the drain region 25. The body 26 includes a depletion layer having a composition surface which is in contact with the insulating layer 22. A gate oxide 28 is interposed between the body 26 and a gate electrode 27.

In the embodiment, the substrate 20 is subjected to apply a negative voltage $V_{sub1}$ as the voltage of the first polarity. Such a voltage $V_{sub1}$ is applied from outside of a LSI, or is applied after producing it in a circuit including the MOS transistor.

The operation of the embodiment will be described. When the negative voltage $V_{sub}$ is adapted to be applied to the substrate 20, electrons are introduced into the substrate 20. That is, a p type neutral region which is not present in the conventional fully depleted SOI MOS transistor is provided in the body 26 electrically by the voltage $V_{sub}$. The MOS transistor having such a structure is referred to an Electrically Induced Body MOS (EIB-MOS) transistor.

As a result, the depth of the depletion layer corresponds to a depth $t_{SOI2}$ of the single crystal layer 21 because there are holes over a composite surface of the body 26. The body effect factors γ of the SOI MOS transistor as shown in FIG. 5 is expressed as the following equation.

$$\gamma \approx 3 t_{fox3}/t_{SOI2} \quad (4)$$

Wherein $t_{fox3}$ is a thickness of a gate oxide 28. This body effect factors γ is not dependent on an impurity concentration of the body. In accordance with the embodiment, therefore, the body effect factors γ can be determined without being dependent on the impurity concentration of the body, and it is understood that the body effect factors γ increases as $t_{SOI2}$ becomes smaller. As a result, it is possible to operate the circuit including the MOS transistor at higher speed and reduce a power consumption of the circuit including the MOS transistor. When the MOS transistor is applied in VTMOS technique as described hereinafter, a large threshold voltage shift can be obtained with small body voltage shift. Therefore, it is possible to operate the circuit including the VTMOS transistor at high speed in an active mode, and to reduce a leakage current.

Figure 6:
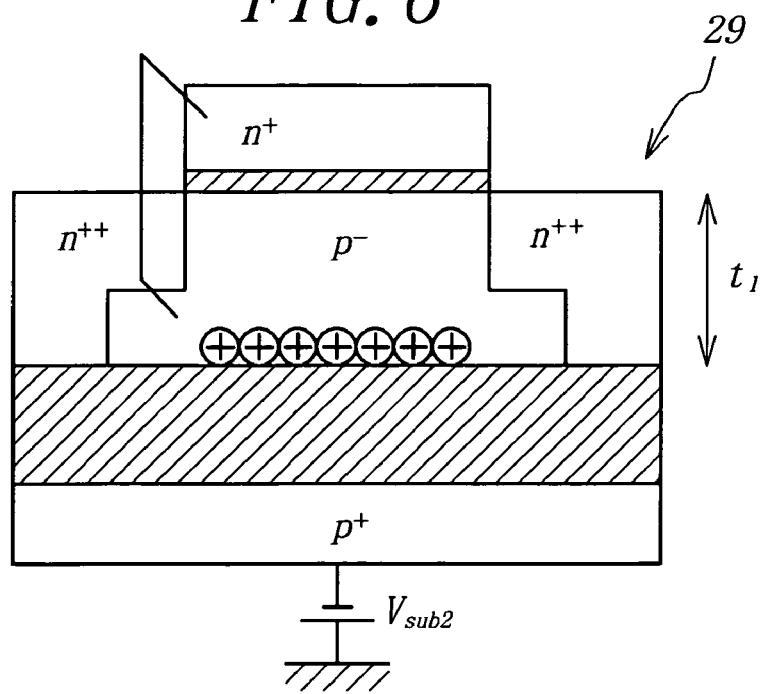
FIG. 6 is a schematic diagram showing a second embodiment of the MOS transistor according to the present invention.

FIG. 6 is a schematic diagram showing a second embodiment of the MOS transistor according to the present invention. In the embodiment, a n type inversion mode DTMOS transistor 29 is used as the MOS transistor. A substrate of the DTMOS transistor 29 is adapted to apply a negative voltage $V_{sub2}$. The MOS transistor as shown in FIG. 6 performs a similar operation with that of the MOS transistor as shown in FIG. 5.

Figure 7:
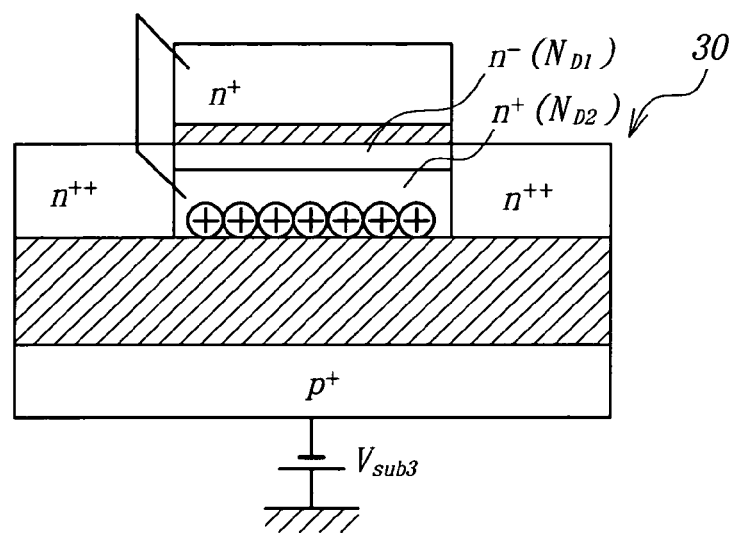
FIG. 7 is a schematic diagram showing a third embodiment of the MOS transistor according to the present invention.

FIG. 7 is a schematic diagram showing a third embodiment of the MOS transistor according to the present invention. In the embodiment, a n type accumulation mode DTMOS transistor 30 is used as the MOS transistor.

The accumulation mode DTMOS transistor 30 has a channel which is doped with impurities so that the channel has the same conductive type (in this case, n type) as that of carriers introduced into the channel. A substrate of the DTMOS transistor 30 is adapted to apply a negative voltage $V_{sub3}$. According to the embodiment, as described below, it is possible to lower the threshold voltage while the body effect factors γ increases remarkably, and a compromise of the fast operation and the reduction of the power consumption can be improved much more.

Figure 8:
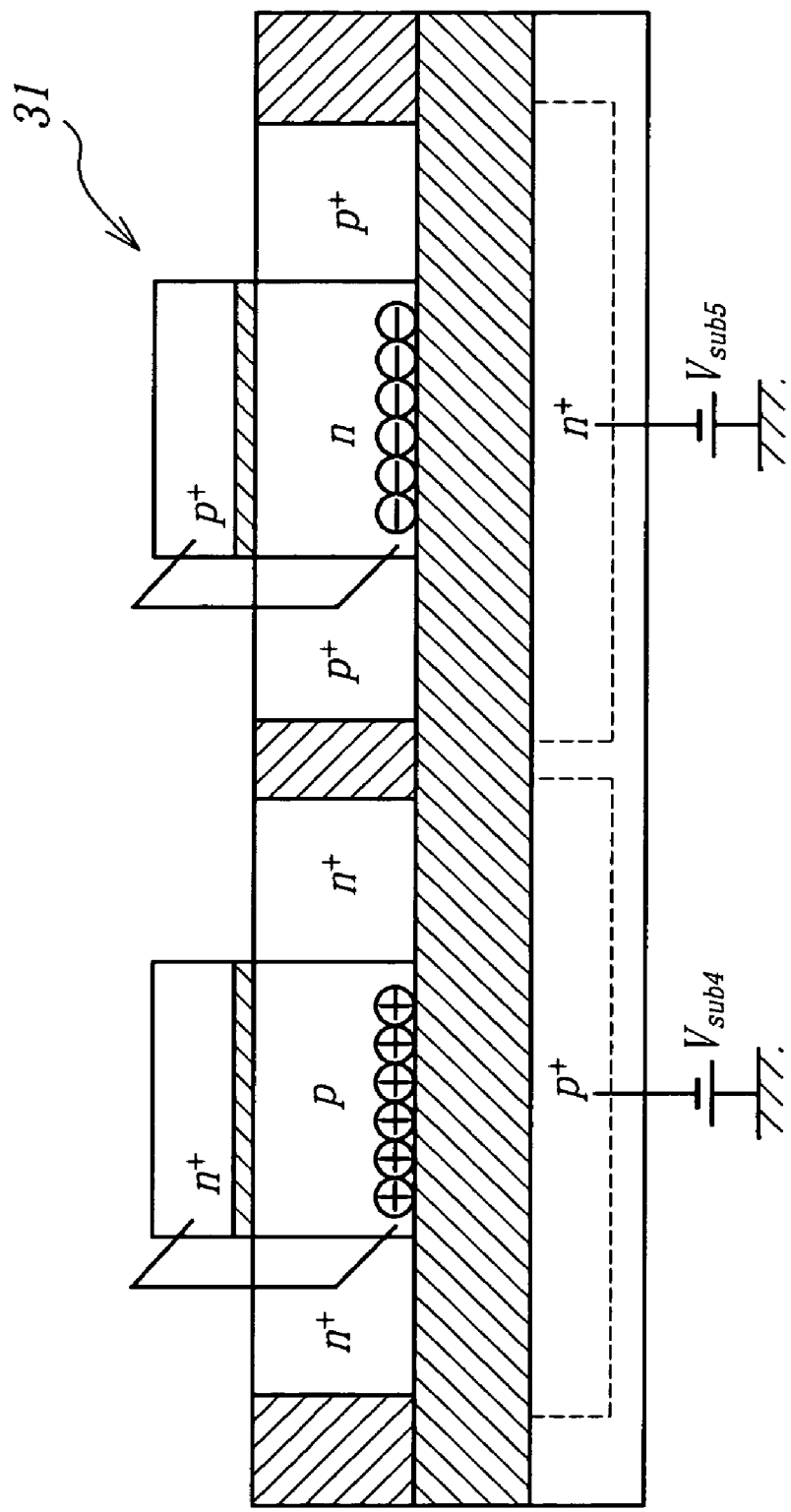
FIG. 8 is a schematic diagram showing a forth embodiment of the MOS transistor according to the present invention.

FIG. 8 is a schematic diagram showing a forth embodiment of the MOS transistor according to the present invention. In the embodiment, a CMOS circuit 31 is formed with a n type inversion mode DTMOS transistor and a p type inversion mode DTMOS transistor. Each of substrates of the n type inversion mode DTMOS transistor and the p type inversion mode DTMOS transistor is adapted to apply negative voltages $V_{sub4}$ and $V_{sub5}$, respectively. The circuit as shown in FIG. 8 performs a similar operation with that of the circuit as described.

Figure 9:
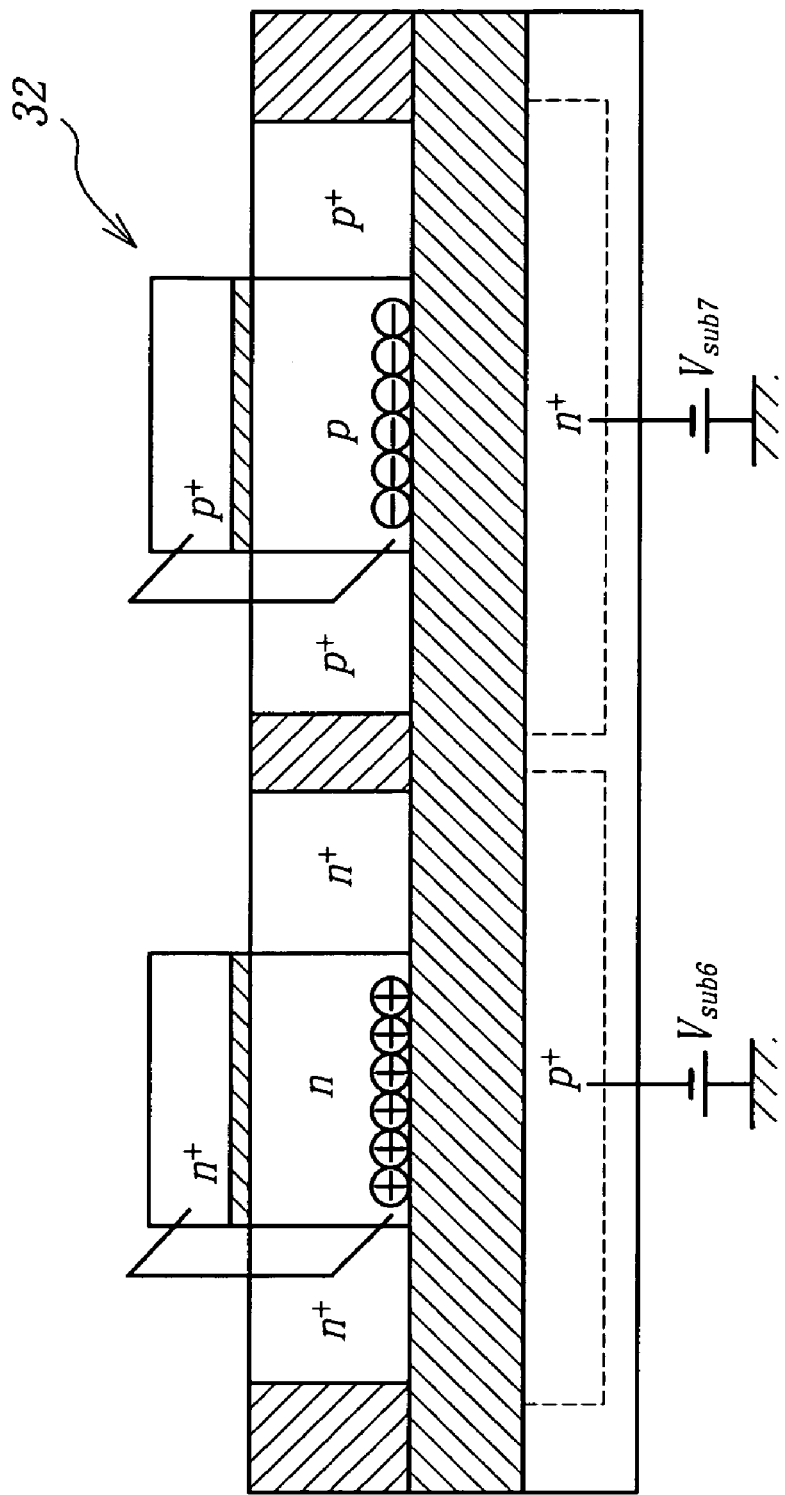
FIG. 9 is a schematic diagram showing a fifth embodiment of the MOS transistor according to the present invention.

FIG. 9 is a schematic diagram showing a fifth embodiment of the MOS transistor according to the present invention. In the embodiment, a CMOS circuit 32 is formed with a n type accumulation mode DTMOS transistor and a p type accumulation mode DTMOS transistor. Each of substrates of the n type accumulation mode DTMOS transistor and the p type accumulation mode DTMOS transistor is adapted to apply negative voltages $V_{sub6}$ and $V_{sub7}$, respectively. The MOS transistor as shown in FIG. 9 performs a similar operation with that of the MOS transistor as described.

FIG. 10 is a schematic diagram showing a sixth embodiment of the MOS transistor according to the present invention. The MOS transistor as shown in FIG. 10 comprises an EIB-VTMOS (EI-variable-threshold MOS) transistor 41 which has a nMOS region 41a and a pMOS region 41b. Each of substrates of the nMOS region 41a and the pMOS region 41b is adapted to apply well voltages $V_{nwell1}$ and $V_{pwell1}$ in addition to a negative voltage $V_{sub8}$ and a positive voltage $V_{sub9}$, respectively. The nMOS region 41a and the pMOS region 41b are not fully isolated from each other by an insulating section 42 electrically.

FIG. 11 is a schematic diagram showing a seventh embodiment of the MOS transistor according to the present invention. In the embodiment, an EIB-VTMOS transistor 43 has a nMOS region 43a and a pMOS region 43b which are fully discrete from each other by an insulating section 44 electrically. In this case, also, each of substrates of the nMOS region 43a and the pMOS region 43b is adapted to apply well voltages $V_{nwell2}$ and $V_{pwell2}$ in addition to a negative voltage $V_{sub10}$ and a positive voltage $V_{sub11}$, respectively.

Figure 12:
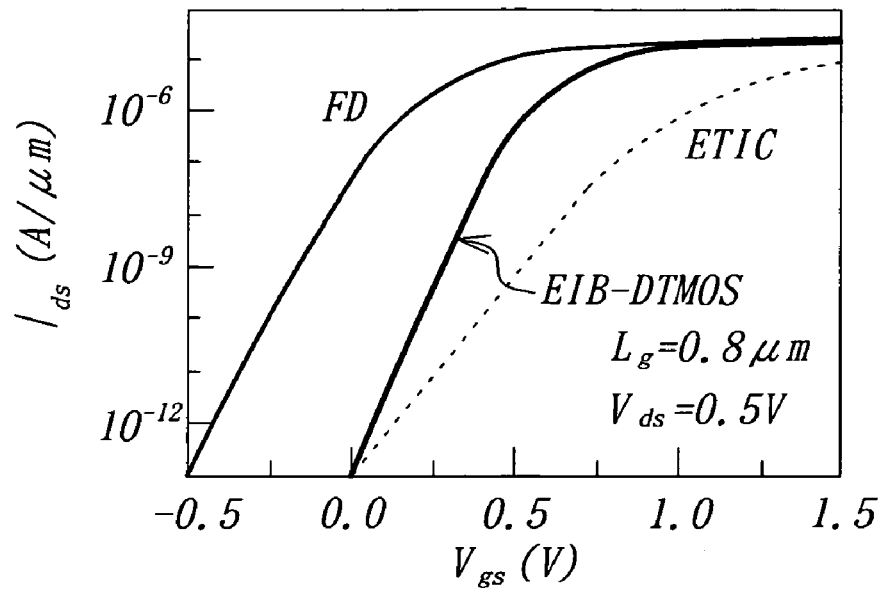
FIG. 12 is a graph showing subthreshold characteristics of an EIB-DTMOS transistor, a fully depleted SOI MOS transistor, and an EIB-MOS transistor having a substrate portion whose voltage is zero.
Figure 13:
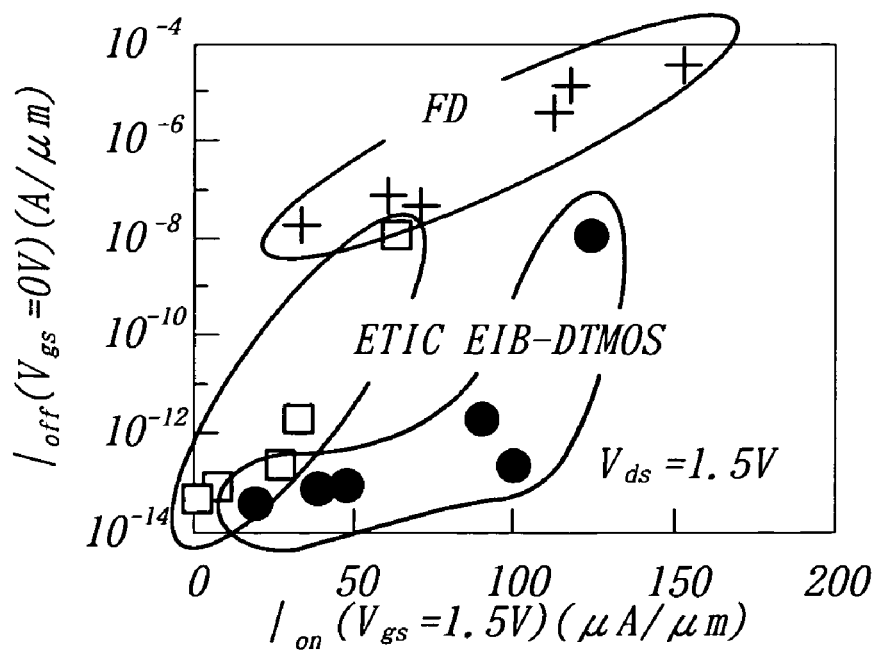
FIG. 13 is a graph showing on/off characteristics of an EIB-DTMOS transistor, a fully depleted SOI MOS transistor, and an EIB-MOS transistor having a substrate portion whose voltage is zero.

Next, characteristics of the EIB-DTMOS transistor, the fully depleted SOI MOS transistor, and the EIB-MOS transistor having a substrate portion whose voltage is zero are compared with each other with reference to FIGS. 12 and 13. Each of these transistors comprises a gate oxide having a thickness of 10 nm, a single crystal layer having a thickness of 40 nm, an insulating layer having a thickness of 100 nm, and a p type body (therefore, inversion mode) having an impurity concentration of $10^{16}$ $cm^{-3}$.

FIG. 12 is a graph showing subthreshold characteristics of the EIB-DTMOS transistor, the fully depleted SOI MOS transistor, and the EIB-MOS transistor having a substrate portion whose voltage is zero. In this graph, each value of gate voltages $V_{gs}$ is plotted along with a horizontal axis of the graph, and each value of drain currents $I_{ds}$ is plotted along with a vertical axis of the graph. In case of the fully depleted SOI MOS transistor whose characteristic is represented by a curve FD, the current, when it is turned on, is high, however, the current, when it is turned off (i.e. $V_{gs}$=0), is also high. In case of the EIB-MOS transistor having a substrate portion whose voltage is zero, the characteristic of which is represented by a curve ETIC, the current, when the EIB-MOS transistor is turned off, is low, however, the current, when the EIB-MOS transistor is turned on, is also low. As a result, the fast operation of the EIB-MOS transistor cannot be achieved. In case of the EIB-DTMOS transistor whose characteristic is represented by a curve EIB-DTMOS, the current, when the EIB-DTMOS transistor is turned on, is high and the current, when the EIB-DTMOS transistor is turned off, is low because the threshold voltage of the EIB-DTMOS transistor changes dynamically from an off-time of the EIB-DTMOS transistor to an on-time of the EIB-DTMOS transistor. Therefore, it is possible to compromise the fast operation and the reduction of the power consumption.

FIG. 13 is a graph showing on/off characteristics of a FD SOI MOS transistor, a EIB MOS SOI transistor and a EIB-DTMOS transistor. In this graph, each value of on-currents $I_{on}$ is plotted along with a horizontal axis of the graph, and each value of off-currents $I_{off}$ is plotted along with a vertical axis of the graph As shown in FIG. 13, it is clear that the off-current of the EIB-DTMOS transistor is low and the on-current of the EIB-DTMOS transistor is high. In this case, the body effect factors γ of the EIB-DTMOS transistor is 0.8. Another characteristic of the EIB-DTMOS transistor is that it has little short channel effect, for example.

Figure 14:
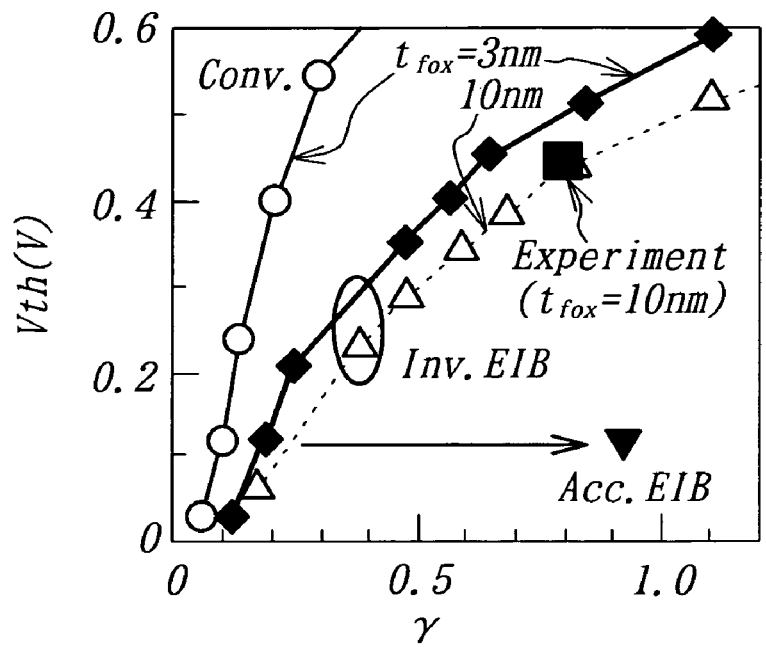
FIG. 14 is a graph showing relations between a threshold voltage and a body effect factor of a conventional DTMOS transistor, an inversion mode EIB-DTMOS transistor and an accumulation mode EIB-DTMOS transistor.
Figure 15:
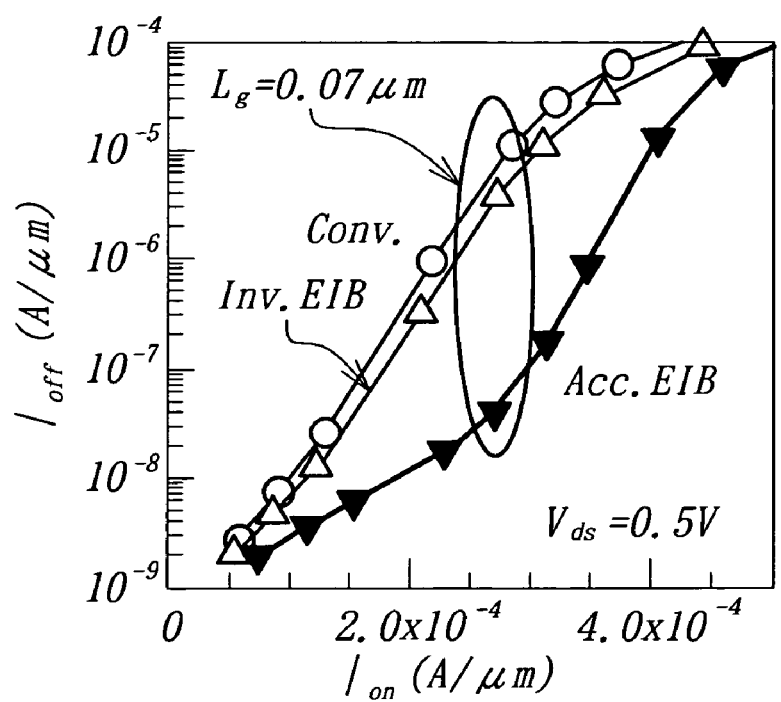
FIG. 15 is a graph showing on/off characteristics of a conventional DTMOS transistor, an inversion mode EIB-DTMOS transistor and an accumulation mode EIB-DTMOS transistor.

Next, characteristics of the conventional DTMOS transistor and the EIB-DTMOS transistor are compared with each other with reference to FIGS. 14 and 15.

FIG. 14 is a graph showing relations between a threshold voltage and a body effect factor of a conventional DTMOS transistor, an inversion mode EIB-DTMOS transistor and an accumulation mode EIB-DTMOS transistor. In this graph, each value of the body effect factors γ is plotted along with a horizontal axis of the graph, and each value of threshold voltages $V_{th}$ is plotted along with a vertical axis of the graph. The characteristics of the conventional DTMOS transistor, the inversion mode EIB-DTMOS transistor, and the accumulation mode EIB-DTMOS transistor are represented by a curves Conv., Inv. BIB, and Acc. EIB, respectively. As shown in FIG. 14, it is clear that the body effect factor γ of the accumulation mode EIB-DTMOS transistor can increase while the threshold voltage $V_{th}$ is low.

FIG. 15 is a graph showing on/off characteristics of a conventional DTMOS transistor, an inversion mode EIB-DTMOS transistor and an accumulation mode EIB-DTMOS transistor. In this graph, each value of on-currents $I_{on}$ is plotted along with a horizontal axis of the graph, and each value of off-currents $I_{off}$ is plotted along with a vertical axis of the graph. As shown in FIG. 15, it is clear that the compromise of the fast operation and the reduction of the power consumption of the accumulation mode EIB-DTMOS transistor is best.

While the present invention has been described above with reference to certain preferred embodiments, it should be noted that they were present by way of examples only and various changes and/or modifications may be made without departing from the scope of the invention. For example, the n type MOS transistor is used as the MOS transistor in the MOS transistor according to the invention, however, a p type MOS transistor can be used instead of the n type MOS transistor. Moreover, a large body effect factor can be utilized using another threshold voltage control technique.

What is claimed is:

1. A MOS transistor with a controlled threshold voltage, comprising a SOI which includes a substrate composed of a semi-conducting material, a single crystal layer composed of a semi-conducting material and an insulating layer interposed between said substrate and said single crystal layer,
    said single crystal layer being formed therein with a source region, a drain region and a surrounded region surrounded by said source region and said drain region,
    said surrounded region including a depletion layer having a composition surface which is in contact with said insulating layer,
    said MOS transistor comprising an EIB-MOS transistor of which said substrate is adapted to be applied with a voltage of a first polarity for inducing charges of a second polarity over said composition surface of the surrounded region.

2. The MOS transistor according to claim 1, wherein said EIB-MOS transistor comprises an EIB-DTMOS transistor.

3. The MOS transistor according to claim 2, wherein said EIB-DTMOS transistor comprises an accumulation mode EIB-DTMOS transistor having a channel which is doped with impurities so that said channel has the same conductive type as that of carriers introduced into said channel.

4. The MOS transistor according to claim 1, wherein said EIB-MOS transistor comprises an EIB-VTMOS transistor.

5. The MOS transistor according to claim 1, included in a CMOS circuit as one of pair of EIB-MOS transistors.

6. A method of controlling a threshold voltage of a MOS transistor with a controlled threshold voltage, said MOS transistor being an EIB-MOS transistor and comprising a SOI which includes a substrate composed of a semi-conducting material, a single crystal layer composed of a semi-conducting material and an insulating layer interposed between said substrate and said single crystal layer, said single crystal layer being formed therein with a source region, a drain region and a surrounded region surrounded by said source region and said drain region, said surrounded region including a depletion layer having a composition surface which is in contact with said insulating layer, wherein said method comprises the step of applying a voltage of a first polarity to said substrate for inducing charges of a second polarity over said composite surface of the surrounded region.

7. A MOS transistor with a threshold voltage controlled by changing a body potential of the MOS transistor, comprising:
    a SOI which includes a substrate composed of a semi-conducting material, a single crystal layer composed of a semi-conducting material and an insulating layer interposed between said substrate and said single crystal layer,
    said single crystal layer being formed therein with a source region, a drain region and a body region surrounded by said source region and said drain region,
    said body region including a depletion layer having a composition surface which is in contact with said insulating layer,
    said MOS transistor comprising an EIB-MOS transistor of which said substrate is applied with a voltage of a first polarity for inducing charges of a second polarity over said composition surface of the body region.

8. The MOS transistor according to claim 7, wherein said EIB-MOS transistor comprises an EIB-DTMOS transistor.

9. The MOS transistor according to claim 8, wherein said EIB-DTMOS transistor comprises an accumulation mode EIB-DTMOS transistor having a channel which is doped with impurities so that said channel has the same conductive type as that of carriers introduced into said channel.

10. The MOS transistor according to claim 7, wherein said EIB-MOS transistor comprises an EIB-VTMOS transistor.

11. The MOS transistor according to claim 7, included in a CMOS circuit as one of pair of EIB-MOS transistors.

12. A method of controlling a threshold voltage of a MOS transistor by changing a body potential of the MOS transistor, said MOS transistor being an EIB-MOS transistor and comprising a SOI which includes a substrate composed of a semi-conducting material, a single crystal layer composed of a semi-conducting material and an insulating layer interposed between said substrate and said single crystal layer, said single crystal layer being formed therein with a source region, a drain region and a body region surrounded by said source region and said drain region, said body region including a depletion layer having a composition surface which is in contact with said insulating layer, wherein said method comprises the step of applying a voltage of a first polarity to said substrate for inducing charges of a second polarity over said composition surface of the body region.

* * * * *